(12) United States Patent
Wang et al.

(10) Patent No.: US 11,749,157 B2
(45) Date of Patent: Sep. 5, 2023

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Xuanyun Wang, Wuhan (CN); Chao Dai, Wuhan (CN); Fang Qin, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/638,112

(22) PCT Filed: Feb. 7, 2022

(86) PCT No.: PCT/CN2022/075329
§ 371 (c)(1),
(2) Date: Feb. 24, 2022

(65) Prior Publication Data
US 2023/0237945 A1    Jul. 27, 2023

(30) Foreign Application Priority Data
Jan. 25, 2022 (CN) .......................... 202210085674.0

(51) Int. Cl.
*G09G 3/20* (2006.01)
(52) U.S. Cl.
CPC ....... *G09G 3/20* (2013.01); *G09G 2300/0809* (2013.01); *G09G 2310/0213* (2013.01);
(Continued)

(58) Field of Classification Search
CPC ............. G09G 3/20; G09G 2300/0809; G09G 2310/0213; G09G 2310/0267;
(Continued)

(56) References Cited

U.S. PATENT DOCUMENTS

2019/0384445 A1* 12/2019 Huang .................. G06F 3/0443
2019/0385502 A1* 12/2019 Yamazaki ................ G09G 3/20
(Continued)

FOREIGN PATENT DOCUMENTS

| CN | 101178872 A | 5/2008 |
|---|---|---|
| CN | 101329484 A | 12/2008 |

(Continued)

OTHER PUBLICATIONS

Chinese Office Action issued in corresponding Chinese Patent Application No. 202210085674.0 dated Apr. 6, 2023, pp. 1-7, 18pp.
Chinese Office Action issued in corresponding Chinese Patent Application No. 202210085674.0 dated Jun. 20, 2023, pp. 1-6, 18pp.

*Primary Examiner* — Sejoon Ahn
(74) *Attorney, Agent, or Firm* — The Roy Gross Law Firm, LLC; Roy Gross

(57) ABSTRACT

The present application provides a display panel and a display device. The display panel includes a gate driving circuit and a plurality of rows of pixel circuits. By electrically connecting a gate of a driving transistor in each of the pixel circuits to at least one oxide thin-film transistor, each of the pixel circuits has a low leakage characteristic, thereby realizing a low-frequency driving display of the pixel circuits. On this basis, a display time interval between two adjacent rows of the pixel circuits can be lengthened about half-frame time, thereby realizing an ultra-low-frequency driving display.

18 Claims, 10 Drawing Sheets

(52) U.S. Cl.
CPC ............... *G09G 2310/0267* (2013.01); *G09G 2310/08* (2013.01); *G09G 2320/0233* (2013.01); *G09G 2320/0247* (2013.01)

(58) Field of Classification Search
CPC ....... G09G 2310/08; G09G 2320/0233; G09G 2320/0247
See application file for complete search history.

(56) References Cited

U.S. PATENT DOCUMENTS

| | | | |
|---|---|---|---|
| 2019/0385555 A1* | 12/2019 | Guan | G11C 19/28 |
| 2019/0385562 A1* | 12/2019 | Xiao | H03M 1/12 |
| 2021/0201816 A1 | 7/2021 | Kim et al. | |
| 2021/0241673 A1 | 8/2021 | Liu et al. | |

FOREIGN PATENT DOCUMENTS

| | | |
|---|---|---|
| CN | 101410884 A | 4/2009 |
| CN | 103262148 A | 8/2013 |
| CN | 107492363 A | 12/2017 |
| CN | 110619850 A | 12/2019 |
| CN | 110706671 A | 1/2020 |
| CN | 111564136 A | 8/2020 |
| CN | 112634833 A | 4/2021 |
| CN | 112863426 A | 5/2021 |
| CN | 112909054 A | 6/2021 |
| KR | 20080058055 A | 6/2008 |
| KR | 20110138006 A | 12/2011 |

\* cited by examiner

DISPLAY PANEL AND DISPLAY DEVICE

CROSS REFERENCE TO RELATED APPLICATIONS

This application is a National Phase of PCT Patent Application No. PCT/CN2022/075329 having International filing date of Feb. 7, 2022, which claims the benefit of priority of Chinese Application No. 202210085674.0 filed on Jan. 25, 2022. The contents of the above applications are all incorporated by reference as if fully set forth herein in their entirety.

FIELD OF INVENTION

The present application is related to the field of display technology and specifically to a display panel and a display device.

BACKGROUND OF INVENTION

With development of multimedia, display devices have become more and more important. Correspondingly, requirements for various types of the display devices are getting higher and higher, especially in the field of smartphones. Ultra-high-frequency driving displays, low-power-consumption driving displays, low-frequency driving displays, and ultra-low-frequency (below 10 Hz) driving displays are directions of development demand at this stage and in the future.

However, it is difficult to realize the ultra-low-frequency driving displays in prior art. Therefore, it is necessary to propose a display panel that can realize the ultra-low-frequency driving displays.

It should be noted that the above description of background technology is only for a purpose of facilitating a clear and complete understanding of technical solutions of the present application. Therefore, it should not be considered that the above-mentioned technical solutions are known to those skilled in the art just because they appear in background art of the present application.

SUMMARY OF INVENTION

The present application provides a display panel and a display device to relieve technical problems of ultra-low-frequency driving displays.

In a first aspect, the present application provides a display panel including a gate driving circuit and a plurality of rows of pixel circuits. The gate driving circuit includes odd-th gate driving units in a cascade connected arrangement and even-th gate driving units in a cascade connected arrangement. Each row of the pixel circuits includes a plurality of the pixel circuits. One of odd rows of the pixel circuits is electrically connected to a corresponding one of the odd-th gate driving units. One of even rows of the pixel circuits is electrically connected to a corresponding one of the even-th gate driving units. Each of the pixel circuits includes a driving transistor and at least one oxide thin-film transistor. A gate of the driving transistor is electrically connected to one of a source or a drain of the at least one oxide thin-film transistor.

In an embodiment, the at least one oxide thin-film transistor includes a first transistor, and one of a source or a drain of the first transistor is electrically connected to the gate of the driving transistor. Each of the pixel circuits further includes a second transistor and a third transistor. One of a source or a drain of the second transistor is electrically connected to one of a source or a drain of the driving transistor. Another one of the source or the drain of the second transistor is electrically connected to another one of the source or the drain of the first transistor. A gate of the second transistor is electrically connected to an output end of an N-th gate driving unit. The second transistor is a polycrystalline silicon thin-film transistor. One of a source or a drain of the third transistor is electrically connected to another one of the source or the drain of the first transistor. A gate of the third transistor is electrically connected to an output end of an (N−2)-th gate driving unit. The third transistor is a polycrystalline silicon thin-film transistor.

In an embodiment, each of the pixel circuits further includes a fourth transistor. One of a source or a drain of the fourth transistor is electrically connected to another one of the source or the drain of the third transistor and is configured to receive an initial signal. A gate of the fourth transistor is electrically connected to the output end of the N-th gate driving unit or the output end of the (N−2)-th gate driving unit. The fourth transistor is a polycrystalline silicon thin-film transistor.

In an embodiment, the at least one oxide thin-film transistor includes a first transistor and a second transistor. One of a source or a drain of the first transistor is electrically connected to the gate of the driving transistor. A gate of the first transistor is electrically connected to an (N−2)-th gate driving unit. The one of the source or the drain of the first transistor is configured to receive an initial signal. One of a source or a drain of the second transistor is electrically connected to the gate of the driving transistor. Another one of the source or the drain of the second transistor is electrically connected to one of a source or a drain of the driving transistor. A gate of the second transistor is electrically connected to an N-th gate driving unit.

In an embodiment, ones of the odd rows or the even rows of the pixel circuits display row-by-row in sequence in a first period of one frame. Another ones of the odd rows or the even rows of the pixel circuits display row-by-row in sequence in a second period of one frame. A start time of the first period is earlier than a start time of the second period.

In an embodiment, the odd-th gate driving units output odd rows of scan signals. The even-th gate driving units output even rows of scan signals. The odd-th gate driving units are electrically connected to the odd rows of the pixel circuits to provide the odd rows of the scan signals to the odd rows of the pixel circuits. The even-th gate driving units are electrically connected to the even rows of the pixel circuits to provide the even rows of the scan signals to the even rows of the pixel circuits. Each of the scan signals in ones of the odd rows or the even rows of the scan signals includes a leading edge of a pulse in a third period of one frame. Each of the scan signals in another ones of the odd rows or the even rows of the scan signals includes the leading edge of the pulse in a fourth period of one frame. The leading edge is one of a rising edge or a falling edge. A start time of the third period is earlier than or at a same time as a start time of the fourth period. An end time of the fourth period is earlier than or at a same time as a start time of the first period.

In an embodiment, the odd-th gate driving units output the odd rows of the scan signals according to first start signals. The even-th gate driving units output the even rows of the scan signals according to second start signals. The first start signals and the second start signals have different phases.

In an embodiment, the display panel is provided with a first frame region, a display region, and a second frame region. The display region is positioned between the first frame region and the second frame region. Both the odd-th gate driving units and the even-th gate driving units are positioned in the first frame region or the second frame region.

In an embodiment, the display panel is provided with a first frame region, a display region, and a second frame region. The display region is positioned between the first frame region and the second frame region. The odd-th gate driving units are positioned in one of the first frame region or the second frame region. The even-th gate driving units are positioned in another one of the first frame region or the second frame region.

In a second aspect, the present application provides a display device including the display panel of at least one of the above-mentioned embodiments.

In the display panel and the display device provided by the present application, by electrically connecting the gate of the driving transistor in each of the pixel circuits to the at least one oxide thin-film transistor, each of the pixel circuits has a low leakage characteristic that can maintain gate potential of the driving transistor in each of the pixel circuits for a long time, thereby realizing a low-frequency driving display of the pixel circuits. On this basis, by configuring ones of the odd rows or the even rows of the pixel circuits and another ones of the odd rows or the even rows display row-by-row in sequence in the first period and the second period of one frame, a display time interval between two adjacent rows of the pixel circuits can be lengthened about half-frame time. This can effectively reduce a visual perception of a brightness difference between the two adjacent rows of the pixel circuits, and reduce or eliminate a flickering phenomenon of the display, thereby realizing an ultra-low-frequency driving display of the display panel or the display device.

DETAILED DESCRIPTION OF EMBODIMENTS

Figure 1:
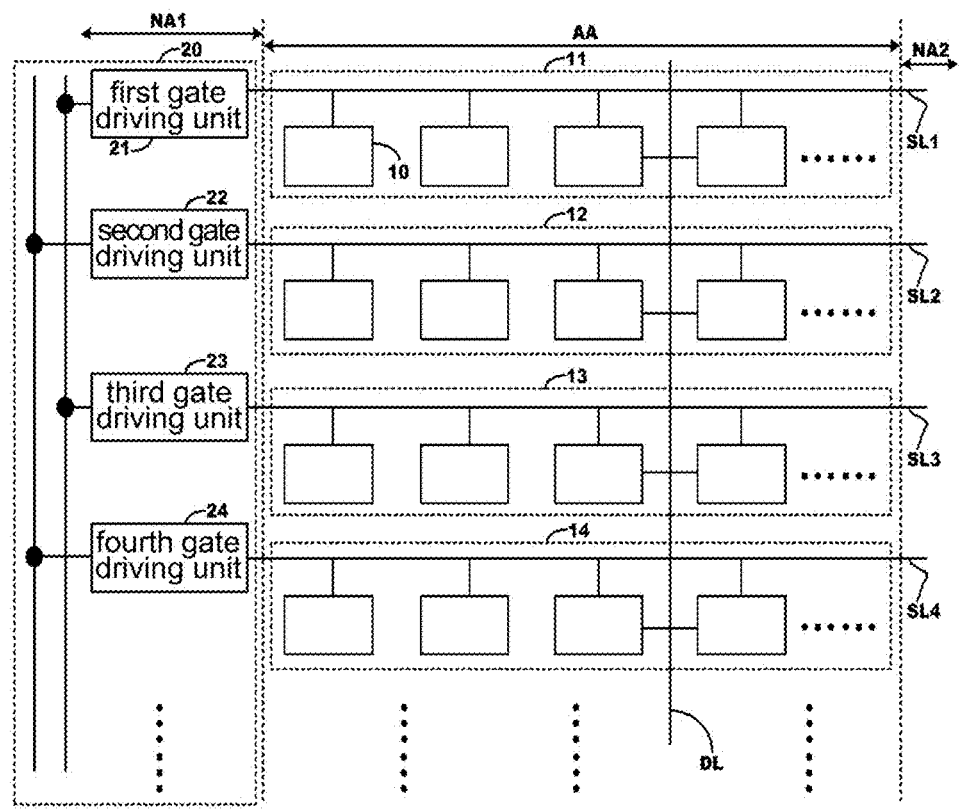
FIG. 1 is a first structural schematic diagram of a display panel provided by an embodiment of the present application.

In order to make purposes, technical solutions, and effects of the present application clearer and more specific, the present application is further described in detail below with reference to the accompanying drawings and examples. It should be understood that the specific embodiments described herein are only used to explain the application, and are not used to limit the present application.

Considering technical problems of prior that ultra-low frequency driving displays are difficult to realized, an embodiment of the present application provides a display panel. Please refer to FIGS. 1-10. As shown in FIGS. 1, 2, and 7-10, the display panel includes a gate driving circuit 20 and a plurality of rows of pixel circuits, such as a first row of the pixel circuits 11, a second row of the pixel circuits 12, a third row of the pixel circuits 13, and a fourth row of the pixel circuits 14. Each row of the pixel circuits includes a plurality of the pixel circuits 10. The plurality of rows of the pixel circuits includes odd rows of the pixel circuits and even rows of the pixel circuits. For example, the odd rows of the pixel circuits may be, the first rows of the pixel circuits 11, the third rows of the pixel circuits 13, and so on. For example, the even rows of the pixel circuits may be, the second row of the pixel circuits 12, the fourth row of the pixel circuits 14, and so on. The gate driving circuit 20 includes odd-th gate driving units in a cascade connected arrangement and even-th gate driving units in a cascade connected arrangement. For example, one of the odd-th gate driving units may be a first gate driving unit 21 or a third gate driving unit 23, and one of the even-th gate driving units may be a second gate driving unit 22 or a fourth gate driving unit 24. One of the odd rows of the pixel circuits is electrically connected to a corresponding one of the odd-th gate driving units. One of the even rows of the pixel circuits is electrically connected to a corresponding one of the even-th gate driving units. Each of the pixel circuits 10 include a driving transistor T1 and at least one oxide thin-film transistor. A gate of the driving transistor T1 is electrically connected to one of a source or a drain of the at least one oxide thin-film transistor.

It can be understood that, in the display panel provided by the present application, by electrically connecting the gate of the driving transistor T1 in each of the pixel circuits 10 to the at least one oxide thin-film transistor, each of the pixel circuits has a low leakage characteristic that can maintain gate potential of the driving transistor T1 in each of the pixel circuits 10 for a long time, thereby realizing a low-frequency driving display of the pixel circuits 10. On this basis, by configuring ones of the odd rows or the even rows of the pixel circuits and another ones of the odd rows or the even rows display row-by-row in sequence in the first period and the second period of one frame, a display time interval between two adjacent rows of the pixel circuits can be lengthened about half-frame time. This can effectively reduce a visual perception of a brightness difference between the two adjacent rows of the pixel circuits, and reduce or eliminate a flickering phenomenon of the display, thereby realizing an ultra-low-frequency driving display of the display panel or the display device.

Figure 7:
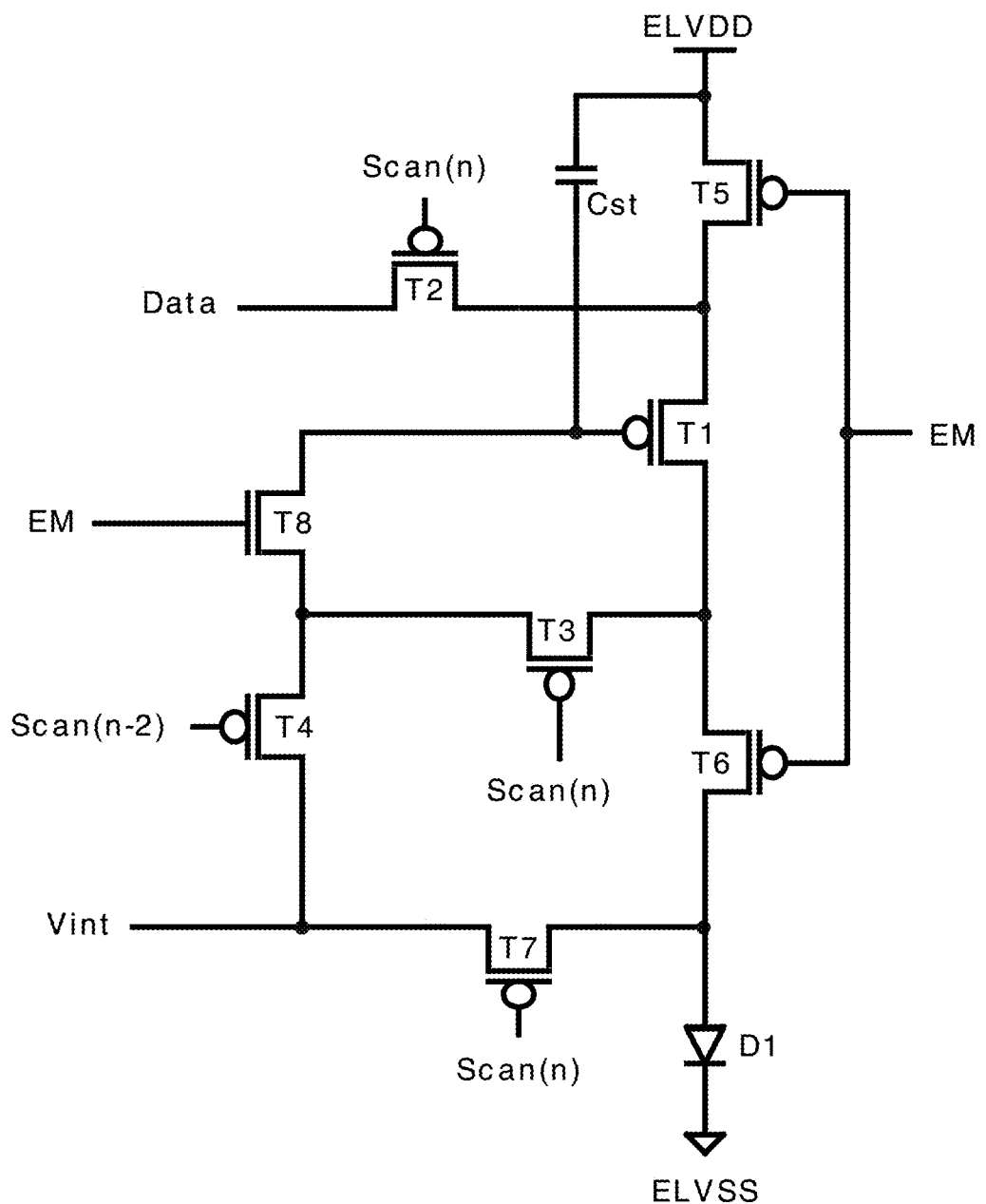
FIG. 7 is a first circuit diagram of each of pixel circuits provided by an embodiment of the present application.
Figure 8:
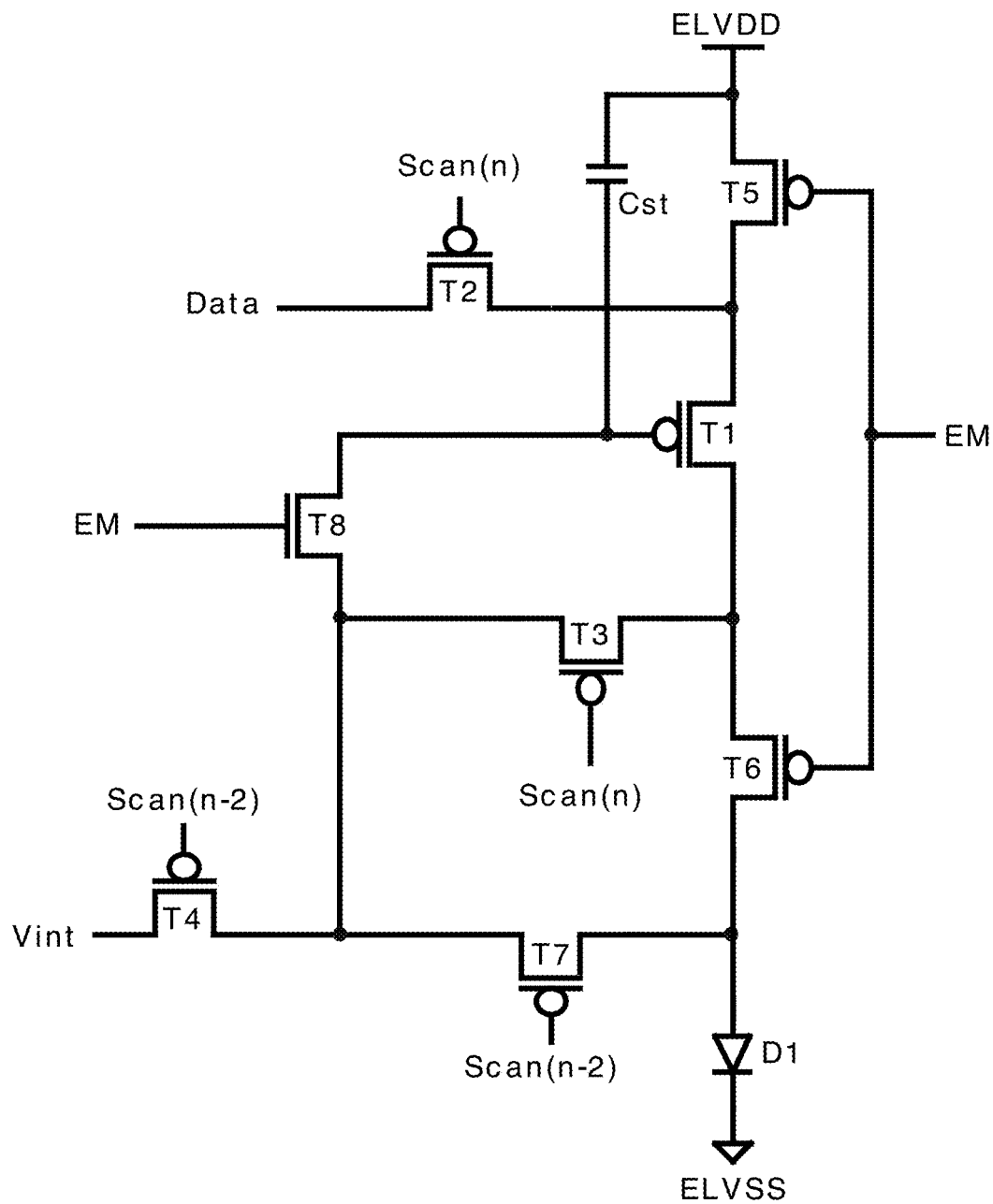
FIG. 8 is a second circuit diagram of each of the pixel circuits provided by an embodiment of the present application.
Figure 9:
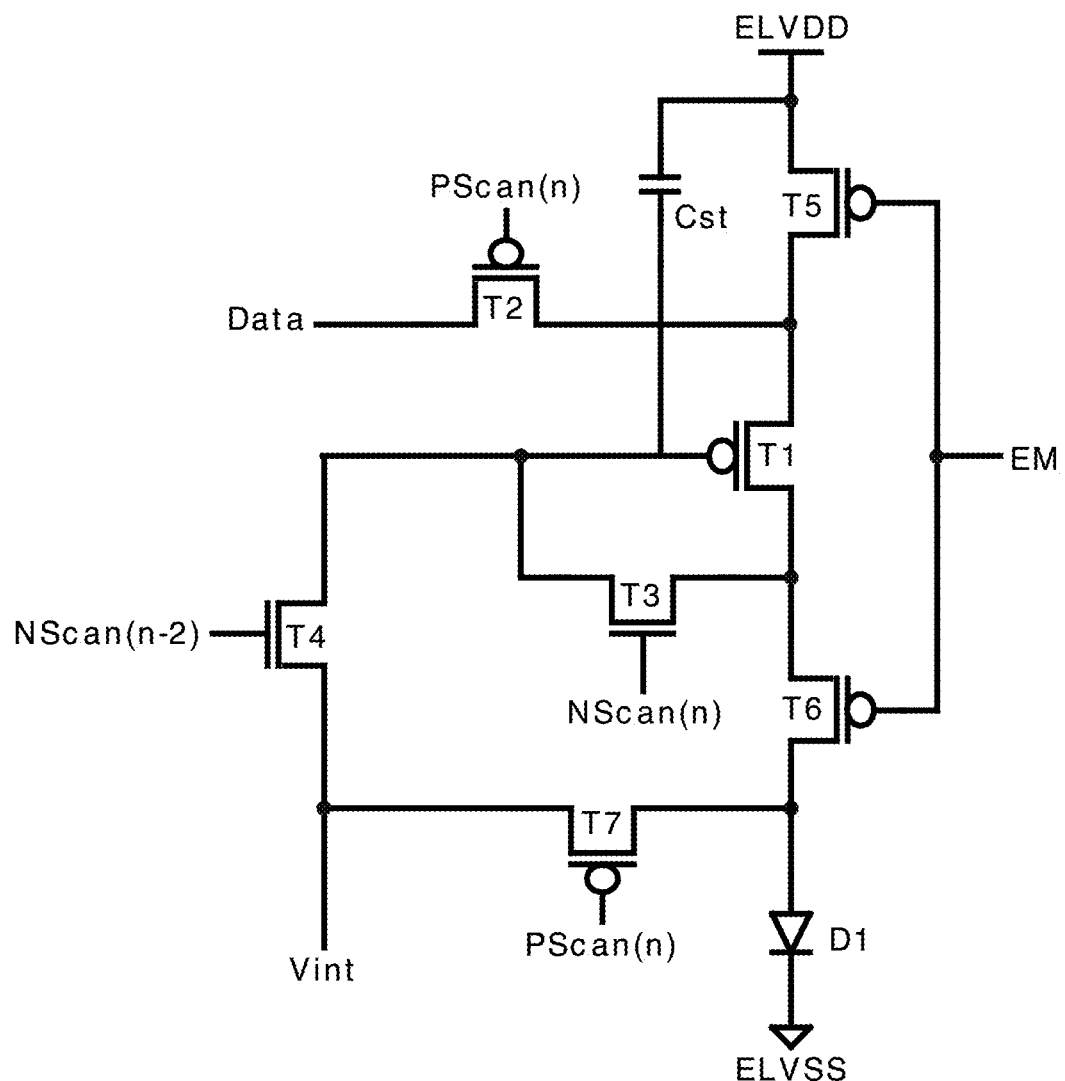
FIG. 9 is a third circuit diagram of each of the pixel circuits provided by an embodiment of the present application.
Figure 10:
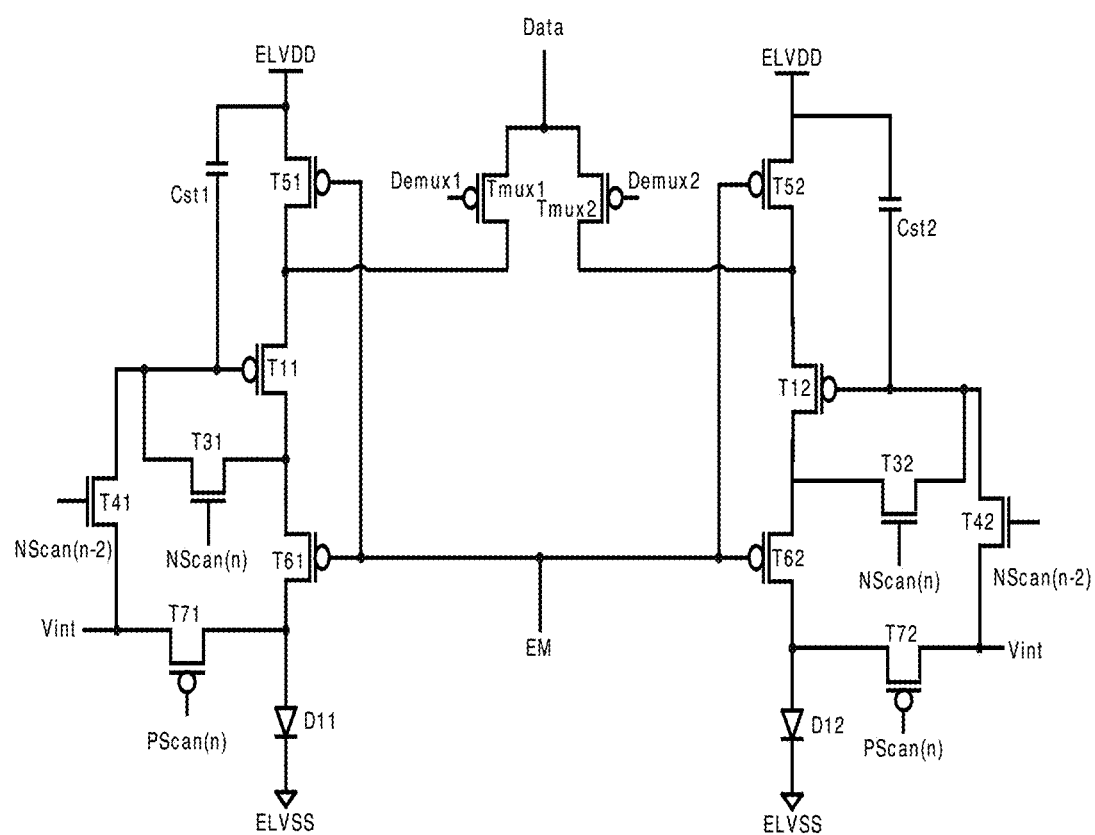
FIG. 10 is a fourth circuit diagram of each of the pixel circuits provided by an embodiment of the present application.

The at least one oxide thin-film transistor may be a transistor T8 shown in FIG. 7 or FIG. 8, or may be a transistor T3 and a transistor T4 shown in FIG. 9, or may also be a transistor T31, a transistor T41, a transistor T32, and a transistor T42 shown in FIG. 10.

In an embodiment, ones of the odd rows or the even rows of the pixel circuits display row-by-row in sequence in a first period of one frame, and another ones of the odd rows or the even rows of the pixel circuits display row-by-row in sequence in a second period of one frame. Each of the pixel circuits 10 has the low leakage characteristic. A start time of the first period is earlier than a start time of the second period.

It should be noted that a light-emitting time or a display time in one frame may include a first period and a second period. In the first period, the odd rows of the pixel circuits, such as the first row of the pixel circuits 11 and the third row of the pixel circuits 13, can display or emit light row-by-row in sequence. In the second period, the even rows of the pixel circuits, such as the second row of the pixel circuits 12 and the fourth row of the pixel circuits 14, can display or emit light row-by-row in sequence. Similarly, in the first period, the even rows of the pixel circuits, such as the second row of the pixel circuits 12 and the fourth row of the pixel circuits 14, can display or emit light row-by-row in sequence. In the second period, the odd rows of the pixel circuits, such as the first row of the pixel circuits 11 and the third row of the pixel circuits 13, can display or emit light row-by-row in sequence. It can be understood that, in this way, a time interval between the two adjacent rows of the pixel circuits for starting display or emit light can be lengthened, which can effectively reduce a visual perception of a brightness difference between the two adjacent rows of the pixel circuits.

Figure 2:
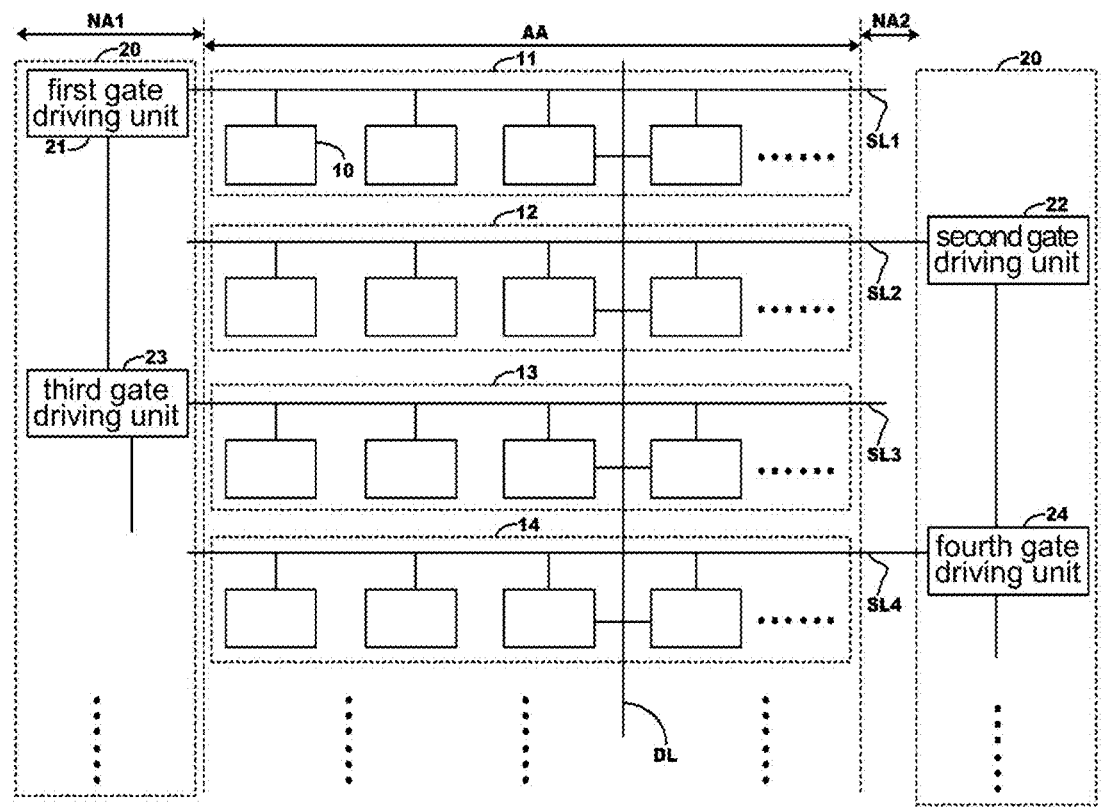
FIG. 2 is a second structural schematic diagram of the display panel provided by an embodiment of the present application.

In an embodiment, as shown in FIG. 1 or 2, the odd-th gate driving units output odd rows of scan signals, and the even-th gate driving units output even rows of scan signals. The odd-th gate driving units are electrically connected to the odd rows of the pixel circuits to provide the odd rows of the scan signals to corresponding odd rows of the pixel circuits. The even-th gate driving units are electrically connected to the even rows of the pixel circuits to provide the even rows of the scan signals to corresponding even rows of the pixel circuits. Each of the scan signals in ones of the odd rows or the even rows of the scan signals includes a leading edge of a pulse in a third period of one frame. Each of the scan signals in another ones of the odd rows or the even rows of the scan signals includes the leading edge of the pulse in a fourth period of one frame. The leading edge is one of a rising edge or a falling edge.

It should be explained that a data writing time in one frame may include a third period and a fourth period. In one frame, the data writing time is earlier than the display time or the light-emitting time. Each pulse in each of the scan signals corresponds to a write of data signals. Each leading edge of the pulse corresponds to a start writing time of the data signals.

It can be understood that the odd rows of the scan signals respectively have the leading edge of the pulse, and the data signals can be sequentially written into corresponding odd rows of the pixel circuits. The even rows of the scan signals respectively have the leading edge of the pulse, and the data signals can be sequentially written into corresponding even rows of the pixel circuits.

In an embodiment, as shown in FIG. 1 or 2, the odd-th gate driving units may be, the first gate driving unit 21, the third gate driving unit 23, and so on, and the even-th gate driving units may be the second gate driving unit 22, the fourth gate driving unit 24, and so on. The odd-th gate driving units output the odd rows of the scan signals according to first start signals. The even-th gate driving units output the even rows of the scan signals according to second start signals. The first start signals and the second start signals have different phases.

It should be explained that, in this embodiment, the odd-th gate driving units, such as the first gate driving unit 21 and the third gate driving unit 23 are cascaded in sequence, and scan timings of the output odd rows of the scan signals can be controlled by the odd-th gate driving units under a control of the first start signals. The even-th gate driving units, such as the second gate driving unit 22 and the fourth gate driving unit 24 are cascaded in sequence, and scan timings of the output even rows of the scan signals can be controlled by the even-th gate driving units under a control of the second start signals. In this way, the scanning timings of the odd rows of the scan signals and the scanning timings of the even rows of the scan signals can be controlled separately, so that the display time interval between two adjacent rows of the pixel circuits can be better realized.

In an embodiment, as shown in FIG. 1, the display panel is provided with a first frame region NA1, a display region AA, and a second frame region NA2. The display region AA is positioned between the first frame region NA1 and the second frame region NA2. Both the odd-th gate driving units and the even-th gate driving units are positioned in the first frame region NA1 or the second frame region NA2.

In an embodiment, as shown in FIG. 2, the display panel is provided with a first frame region NA1, a display region AA, and a second frame region NA2. The display region AA is positioned between the first frame region NA1 and the second frame region NA2. The odd-th gate driving units are positioned in one of the first frame region NA1 or the second frame region NA2. The even-th gate driving units are positioned in another one of the first frame region NA1 or the second frame region NA2.

In an embodiment, as shown in FIG. 1 or 2, the display panel further includes a plurality of scan lines, such as a scan line SL1, a scan line SL2, a scan line SL3, and a scan line SL4. The plurality of scan lines include odd-th scan lines and even-th scan lines. For example, the odd-th scan lines may be the scan line SL1, the scan line SL3, and so on, and the even-th scan lines may be the scan line SL2, the scan line SL4, and so on. One of the odd-th scan lines is electrically connected to a corresponding one of the odd-th gate driving units, and one of the odd rows of the pixel circuits is electrically connected to two of the odd-th scan lines. One of the even-th scan lines is electrically connected to a corresponding one of the even-th gate driving units, and one of the even rows of the pixel circuits is electrically connected to two of the even-th scan lines.

In an embodiment, as shown in FIG. 1 or 2 and 10, the display panel further includes a plurality of data lines DL configured to transmit data signals. One of the data lines DL is electrically connected the pixel circuits in two different columns and writes the data signals to two of the pixel circuits 10 in a same row in a time-sharing manner.

It can be understood that, in this embodiment, one of the data lines DL is electrically connected to the pixel circuits in two different columns 10, which can save a number of the data lines DL in the display region AA, thereby increasing an aperture ratio of the display panel.

Figure 3:
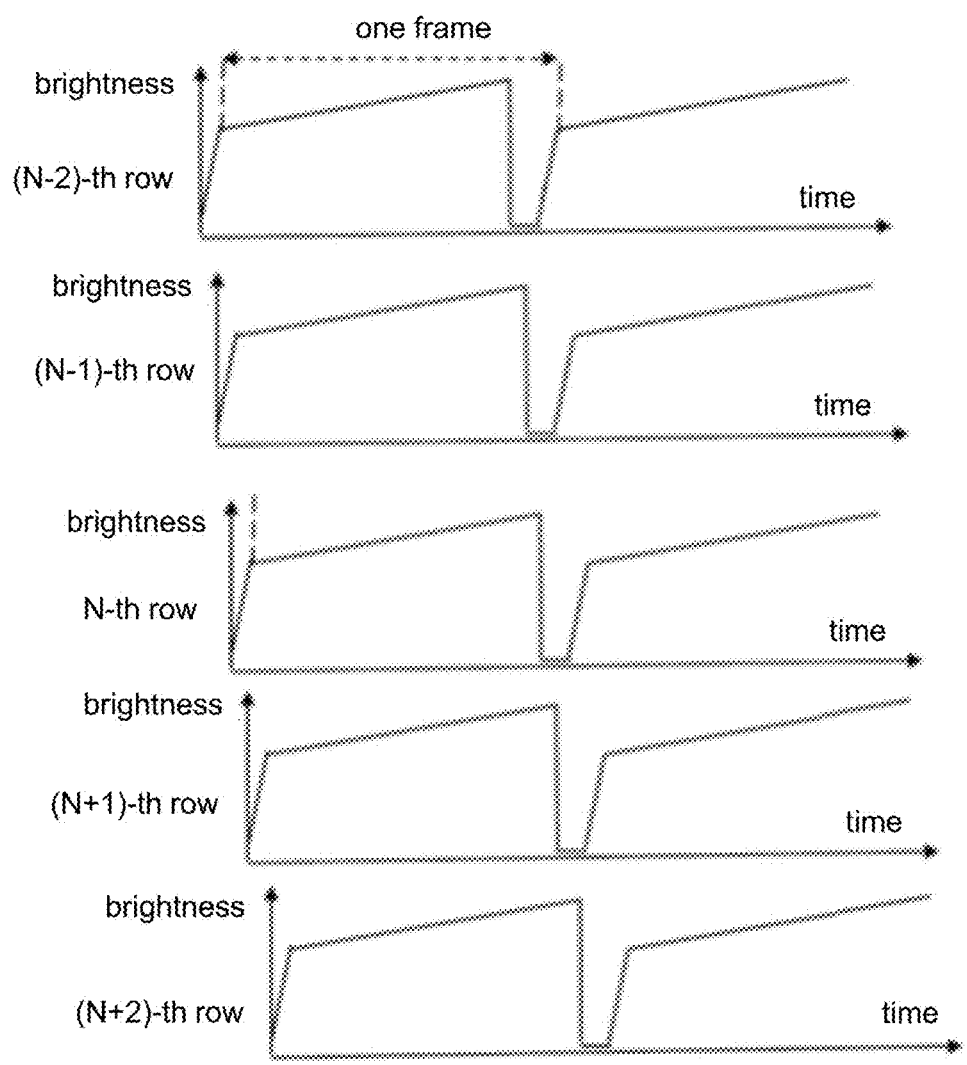
FIG. 3 is a display timing diagram before improvement.

FIG. 3 a display timing diagram before improvement. In a period of one frame, an (N−2)-th row of the pixel circuits, an (N−1)-th row of the pixel circuits, an N-th row of the pixel circuits, an (N+1)th row of the pixel circuits, an (N+2)-th row of the pixel circuits, and so on display row-by-row in sequence. The display time interval between two adjacent rows of the pixel circuits is short, and their brightness difference is large, which is easy to visually perceive flicker and seriously affects a picture quality in a circumstance of an ultra-low-frequency driving display.

Figure 4:
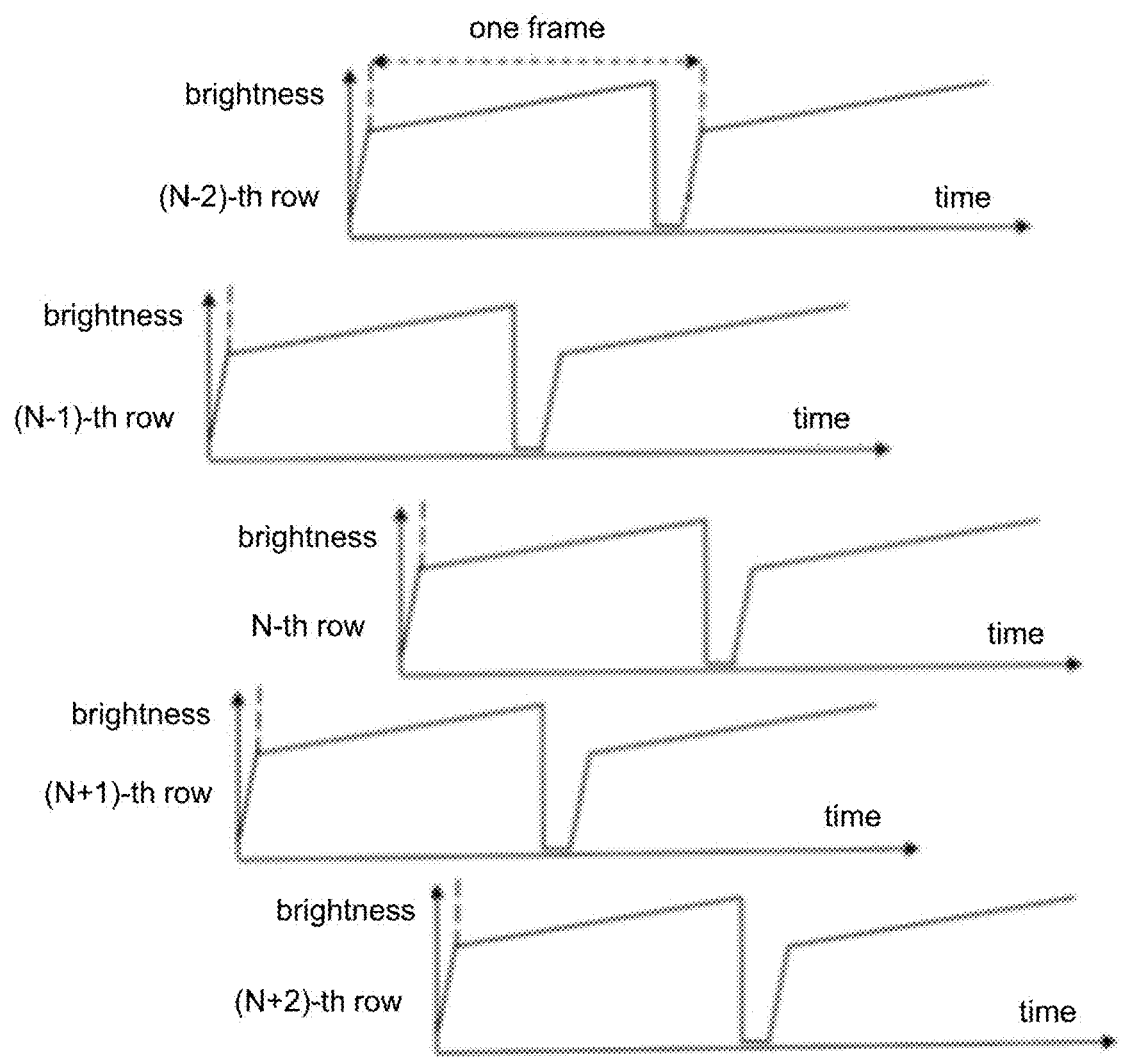
FIG. 4 is a display timing diagram of the display panel shown in FIG. 1 or 2.

A display sequence of the display panel provided by the above embodiment is shown in FIG. 4. In the period of one frame, the (N−1)-th row of the pixel circuits, the (N+1)-th row of the pixel circuits, and so on are displayed row-by-row in sequence. Then, (N−2)-th row of the pixel circuits, N-th row of the pixel circuits, (N+2)-th row of the pixel circuits, and so on are displayed row-by-row in sequence. This can effectively reduce the visual perception of the brightness difference between the two adjacent rows of the pixel circuits, and reduce or eliminate the flickering phenomenon of the display, so as to realize the ultra-low-frequency driving display and even support an ultra-low-frequency driving display below 1 Hz.

Figure 5:
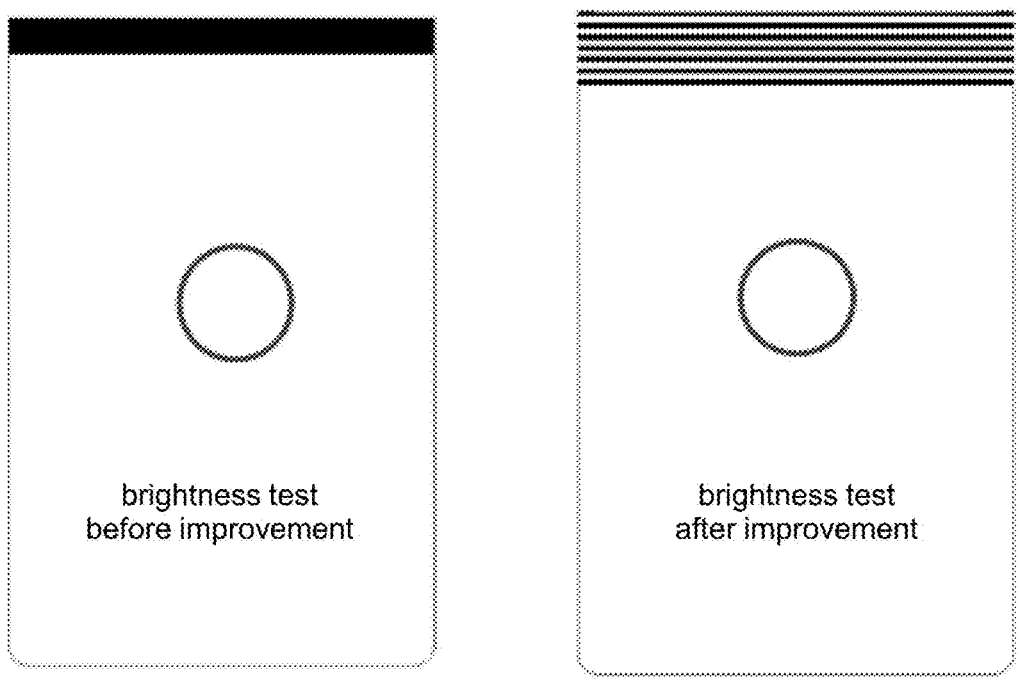
FIG. 5 is a comparison diagram of brightness before and after the improvement provided by an embodiment of the present application.

FIG. 5 is a comparison diagram of brightness before and after the improvement. Apparently, a brightness test result after improvement is better than a brightness test result before improvement.

Figure 6:
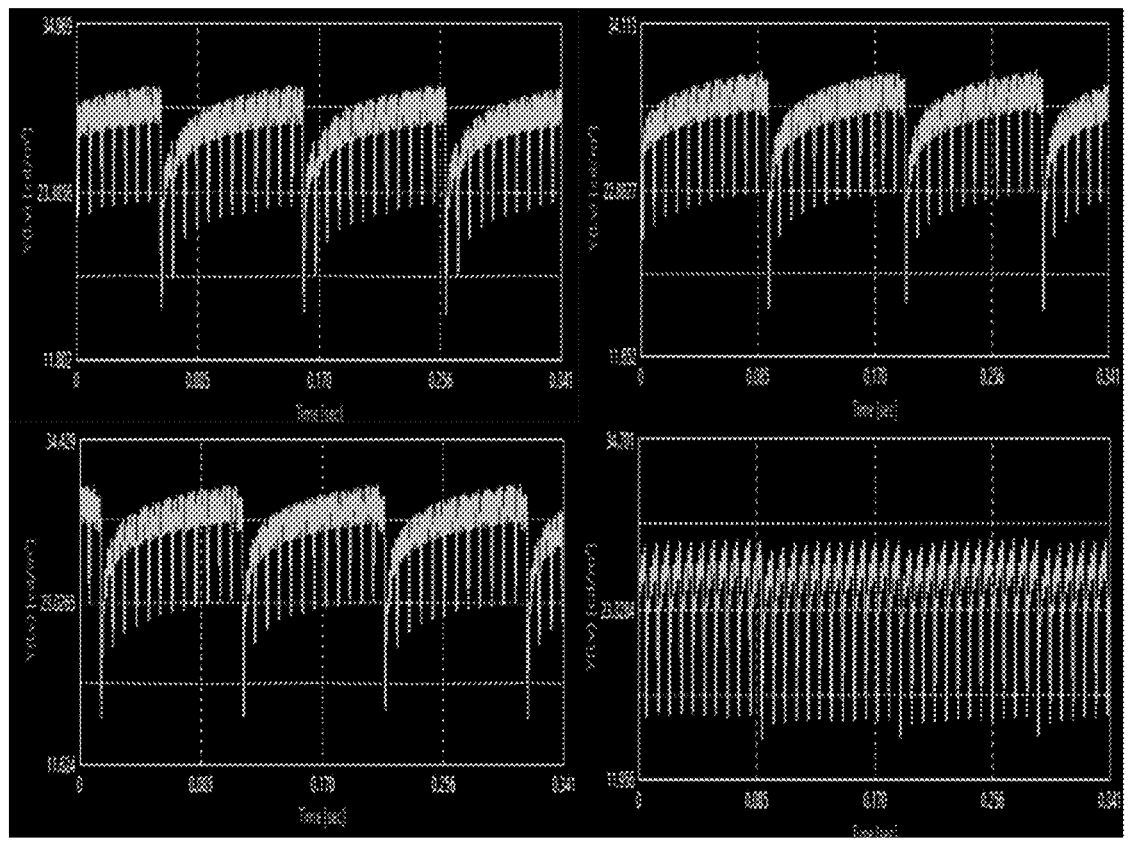
FIG. 6 is a comparison diagram of brightness variations before and after the improvement provided by an embodiment of the present application.

FIG. 6 is a comparison diagram of brightness variations before and after the improvement. In each small diagram, an abscissa represents time in seconds, and an ordinate represents brightness in $cd/m^2$ or nit. Upper left, upper right, and lower left small diagrams in FIG. 6 are changes of brightness over time before the improvement. A lower right small diagram in FIG. 6 is a change of brightness over time after the improvement. It can be seen from these comparisons that the brightness variation of the lower right small diagram is significantly smaller than that of any of the upper left small diagram, the upper right small diagram, and the lower left small diagram.

In an embodiment, as shown in FIG. 7 or 8, the at least one oxide thin-film transistor includes a first transistor. One of a source or a drain of the first transistor is electrically connected to the gate of the driving transistor T1. Each of the pixel circuits further includes a second transistor and a third transistor. One of a source or a drain of the second transistor is electrically connected to one of a source or a drain of the driving transistor T1. Another one of the source or the drain of the second transistor is electrically connected to another one of the source or the drain of the first transistor. A gate of the second transistor is electrically connected to an output end of an N-th gate driving unit. The second transistor is a polycrystalline silicon thin-film transistor. One of a source or a drain of the third transistor is electrically connected to another one of the source or the drain of the first transistor. A gate of the third transistor is electrically connected to an output end of an (N−2)-th gate driving unit. The third transistor is a polycrystalline silicon thin-film transistor.

The first transistor may be the transistor T8 shown in FIG. 7 or 8, the second transistor may be the transistor T3 shown in FIG. 7 or 8, and the third transistor may be the transistor T4 shown in FIG. 7 or 8. An output end of the N-th gate driving unit outputs a scan signal Scan(n). An output end of the (N−2)-th gate driving unit outputs a scan signal Scan (n−2).

In an embodiment, the pixel circuits further include a writing transistor T2. One of a source or a drain of the writing transistor T2 is electrically connected to another of the source or the drain of the driving transistor T1. Another one of the source or the drain of the writing transistor T2 is configured to receive the data signals Data. A gate of the writing transistor T2 is electrically connected to the output end of the N-th gate driving unit.

It can be understood that, in this embodiment, the gate of the driving transistor T1 is only electrically connected to one of the source or the drain of the first transistor, which can effectively reduce a gate leakage current of the driving transistor T1. In addition, the first transistor is configured as the oxide thin-film transistor to further reduce the gate leakage current of the driving transistor T1. Therefore, after the data signals Data is written to the gate of the driving transistor T1, it is easier to be kept, so as to ensure that a larger proportion of the written data signals Data can be configured to turn on the driving transistor T1.

In an embodiment, as shown in FIG. 7, the pixel circuits may further include a third transistor T4 and a fourth transistor T7. One of a source or a drain of the third transistor T4 is electrically connected to another one of the source or the drain of the first transistor. Another one of the source or the drain of the third transistor T4 is electrically connected to one of a source or a drain of the fourth transistor T7 and is configured to receive an initial signal Vint. A gate of the third transistor T4 is configured to receive the scan signal Scan(n−2). A gate of the fourth transistor T7 is electrically connected to the gate of the writing transistor T2 and the gate of the second transistor, and is configured to receive the scan signal Scan(n).

In an embodiment, as shown in FIG. 8, the pixel circuits may further include a third transistor T4 and a fourth transistor T7. One of a source or a drain of the third transistor T4 is electrically connected to another one of the source or the drain of the first transistor and one of a source or a drain of the fourth transistor T7. Another one of the source or the drain of the third transistor T4 is configured to receive an initial signal Vint. A gate of the third transistor T4 is electrically connected to a gate of the fourth transistor T7, and is configured to receive the scan signal Scan(n−2).

In an embodiment, as shown in FIG. 7 or 8, the pixel circuits may further include a transistor T5, a transistor T6, a light-emitting device D1, and a storage capacitor Cst. One of a source or a drain of the transistor T5 is electrically connected to one end of the storage capacitor Cst, and is configured to receive a power positive signal ELVDD. Another end of the storage capacitor Cst is electrically connected to the gate of the driving transistor T1. Another one of the source or the drain of the transistor T5 is electrically connected to another one of the source or the drain of the driving transistor T1. One of a source or a drain of the transistor T6 is electrically connected to one of the source or the drain of the driving transistor T1. Another one of the source or the drain of the transistor T6 is electrically connected to an anode of the light emitting device D1 and another one of the source or the drain of the fourth transistor T7. A cathode of the light-emitting device D1 is configured to receive a power supply negative signal ELVSS or a zero potential signal. A gate of the transistor T5 is electrically connected to a gate of the transistor T6 and the gate of the first transistor, and is configured to receive the light-emitting control signal EM.

The second transistor, the third transistor T4, the fourth transistor T7, the writing transistor T2, the driving transistor T1, the transistor T5, and the transistor T6 can all be P-channel thin-film transistors, and specifically can also be low-temperature polycrystalline silicon thin-film transistors. The first transistor can be an N-channel thin film transistor, and specifically can also be a metal oxide thin-film transistor, such as an indium-gallium-zinc oxide thin-film transistor.

In an embodiment, as shown in FIG. 9 or 10, the at least one oxide thin-film transistor may include a first transistor and a second transistor. One of a source or a drain of the first transistor is electrically connected to the gate of the driving transistor T1. A gate of the first transistor is electrically connected to the (N−2)-th gate driving unit. The one of the source or the drain of the first transistor is configured to receive an initial signal Vint. One of a source or a drain of the second transistor is electrically connected to the gate of the driving transistor T1. Another one of the source or the drain of the second transistor is electrically connected to one of the source or the drain of the driving transistor T1. A gate of the second transistor is electrically connected to the N-th gate driving unit.

In this embodiment, the first transistor may be the transistor T4 shown in FIG. 9, and the second transistor may be the transistor T3 shown in FIG. 9. The first transistor may be the transistor T41 shown in FIG. 10, and the second transistor may be the transistor T31 shown in FIG. 10. The first transistor may be the transistor T42 shown in FIG. 10, and the second transistor may be the transistor T32 shown in FIG. 10.

It can be understood that, in this embodiment, although the gate of the driving transistor T1 is connected to one of the source or the drain of the first transistor and one of the source or the drain of the second transistor, since both the second transistor and the first transistor are configured as the oxide thin-film transistors, they can also effectively reduce the gate leakage current of driving transistor T1. Therefore, after the data signals Data is written to the gate of the driving transistor T1, it can also be kept, so as to ensure that a larger proportion of the written data signals Data can be configured to turn on the driving transistor T1.

The pixel circuits further include a writing transistor T2. One of a source or a drain of the writing transistor T2 is electrically connected to another one of the source or a drain of the driving transistor T1. Another one of the source or the drain of the writing transistor T2 is configured to receive the data signals Data. The second transistor is turned on or off in synchronization with the writing transistor T2.

It should be explained that the gate of the writing transistor T2 is configured to receive a scan signal PScan(n), the gate of the second transistor is configured to receive a scan signal NScan(n), and the gate of the first transistor is configured to receive a scan signal NScan(n−2).

As shown in FIG. 9, the pixel circuits may further include a transistor T7. One of a source or a drain of the transistor T7 is electrically connected to another one of the source or the drain of the first transistor, and is configured to receive the initial signal Vint. A gate of the transistor T7 is electrically connected to the gate of the writing transistor T2.

In an embodiment, as shown in FIG. 9, the pixel circuits may further include a transistor T5, a transistor T6, a light-emitting device D1, and a storage capacitor Cst. One of a source or a drain of the transistor T5 is electrically connected to one end of the storage capacitor Cst, and is configured to receive a power positive signal ELVDD. Another end of the storage capacitor Cst is electrically connected to the gate of the driving transistor T1. Another one of the source or the drain of the transistor T5 is electrically connected to another one of the source or the drain of the driving transistor T1. One of a source or a drain of the transistor T6 is electrically connected to one of the source or the drain of the driving transistor T1. Another one of the source or the drain of the transistor T6 is electrically connected to an anode of the light emitting device D1 and another one of the source or the drain of the fourth transistor T7. A cathode of the light-emitting device D1 is configured to receive a power supply negative signal ELVSS or a zero potential signal. A gate of the transistor T5 is electrically connected to a gate of the transistor T6 and the gate of the first transistor, and is configured to receive the light-emitting control signal EM.

The transistor T4, the transistor T7, the writing transistor T2, the driving transistor T1, the transistor T5, and the transistor T6 may all be P-channel thin-film transistors, and specifically can also be low-temperature polycrystalline silicon thin-film transistors. The second transistor and the first transistor can be an N-channel thin film transistor, and specifically can also be a metal oxide thin-film transistor, such as an indium-gallium-zinc oxide thin-film transistor.

In an embodiment, the pixel circuits shown in FIG. 10 include two of the pixel circuits shown in FIG. 9. Different from that shown in FIG. 9, in FIG. 10, adjacent two of the pixel circuits in a same row can time-sharingly multiplex one of the data signals Data, which can reduce a number of the data lines and increase the aperture ratio of the display panel.

Specifically, a transistor Tmux1 and a transistor Tmux2 are time-sharingly turned on under a control of a signal Demux1 and a signal Demux2 respectively, so a pulse of one of the data signals Data can be time-sharingly written to two of the pixel circuits on its left and right, thereby reducing the number of the data lines.

In an embodiment, this embodiment provides a display device, which includes the display panel in at least one of the above-mentioned embodiments.

It can be understood that, in the display device provided by the present application, by electrically connecting the gate of the driving transistor T1 in each of the pixel circuits 10 to the at least one oxide thin-film transistor, each of the pixel circuits has a low leakage characteristic that can maintain gate potential of the driving transistor T1 in each of the pixel circuits 10 for a long time, thereby realizing a low-frequency driving display of the pixel circuits 10. On this basis, by configuring ones of the odd rows or the even rows of the pixel circuits and another ones of the odd rows or the even rows display row-by-row in sequence in the first period and the second period of one frame, a display time interval between two adjacent rows of the pixel circuits can be lengthened about half-frame time. This can effectively reduce a visual perception of a brightness difference between the two adjacent rows of the pixel circuits, and reduce or eliminate a flickering phenomenon of the display, thereby realizing an ultra-low-frequency driving display of the display panel or the display device.

It can be understood that those having ordinary skills of the art may easily contemplate various changes and modifications of the technical solution and technical ideas of the present application and all these changes and modifications are considered within the protection scope of right for the present application.

What is claimed is:

1. A display panel, comprising:
   a gate driving circuit comprising odd-th gate driving units in a cascade connected arrangement and even-th gate driving units in a cascade connected arrangement; and
   a plurality of rows of pixel circuits, wherein each row of the pixel circuits comprises a plurality of the pixel circuits, each of odd rows of the pixel circuits is electrically connected to a corresponding one of the odd-th gate driving units, and each of even rows of the pixel circuits is electrically connected to a corresponding one of the even-th gate driving units;
   wherein each of the pixel circuits comprises a driving transistor and at least one oxide thin-film transistor, and a gate of the driving transistor is electrically connected to one of a source or a drain of the at least one oxide thin-film transistor; and
   wherein the at least one oxide thin-film transistor comprises a first transistor, and one of a source or a drain of the first transistor is electrically connected to the gate of the driving transistor; and
   each of the pixel circuits further comprises:

a second transistor, wherein one of a source or a drain of the second transistor is electrically connected to one of a source or a drain of the driving transistor, another one of the source or the drain of the second transistor is electrically connected to another one of the source or the drain of the first transistor, a gate of the second transistor is electrically connected to an output end of an N-th gate driving unit, and the second transistor is a polycrystalline silicon thin-film transistor; and a third transistor, wherein one of a source or a drain of the third transistor is electrically connected to another one of the source or the drain of the first transistor, a gate of the third transistor is electrically connected to an output end of an (N−2)-th gate driving unit, and the third transistor is a polycrystalline silicon thin-film transistor.

2. The display panel according to claim 1, wherein each of the pixel circuits further comprises a fourth transistor, one of a source or a drain of the fourth transistor is electrically connected to another one of the source or the drain of the third transistor and is configured to receive an initial signal, a gate of the fourth transistor is electrically connected to the output end of the N-th gate driving unit or the output end of the (N−2)-th gate driving unit, and the fourth transistor is a polycrystalline silicon thin-film transistor.

3. The display panel according to claim 1, wherein the at least one oxide thin-film transistor comprises:

a first transistor, wherein one of a source or a drain of the first transistor is electrically connected to the gate of the driving transistor, a gate of the first transistor is electrically connected to an (N−2)-th gate driving unit, and the one of the source or the drain of the first transistor is configured to receive an initial signal; and a second transistor, wherein one of a source or a drain of the second transistor is electrically connected to the gate of the driving transistor, another one of the source or the drain of the second transistor is electrically connected to one of a source or a drain of the driving transistor, a gate of the second transistor is electrically connected to an N-th gate driving unit.

4. The display panel according to claim 1, wherein ones of the odd rows or the even rows of the pixel circuits display row-by-row in sequence in a first period of one frame, and another ones of the odd rows or the even rows of the pixel circuits display row-by-row in sequence in a second period of one frame; and a start time of the first period is earlier than a start time of the second period.

5. The display panel according to claim 4, wherein the odd-th gate driving units output odd rows of scan signals, and the even-th gate driving units output even rows of scan signals;

the odd-th gate driving units are electrically connected to the odd rows of the pixel circuits to provide the odd rows of the scan signals to the odd rows of the pixel circuits, and the even-th gate driving units are electrically connected to the even rows of the pixel circuits to provide the even rows of the scan signals to the even rows of the pixel circuits;

each of the scan signals in ones of the odd rows or the even rows of the scan signals comprises a leading edge of a pulse in a third period of one frame, each of the scan signals in another ones of the odd rows or the even rows of the scan signals comprises the leading edge of the pulse in a fourth period of one frame, and the leading edge is one of a rising edge or a falling edge; and a start time of the third period is earlier than or at a same time as a start time of the fourth period, and an end time of the fourth period is earlier than or at a same time as a start time of the first period.

6. The display panel according to claim 5, wherein the odd-th gate driving units output the odd rows of the scan signals according to first start signals, and the even-th gate driving units output the even rows of the scan signals according to second start signals; and the first start signals and the second start signals have different phases.

7. The display panel according to claim 6, wherein the display panel is provided with a first frame region, a display region, and a second frame region, and the display region is positioned between the first frame region and the second frame region; and both the odd-th gate driving units and the even-th gate driving units are positioned in the first frame region or the second frame region.

8. The display panel according to claim 6, wherein the display panel is provided with a first frame region, a display region, and a second frame region, and the display region is positioned between the first frame region and the second frame region; and the odd-th gate driving units are positioned in one of the first frame region or the second frame region, and the even-th gate driving units are positioned in another one of the first frame region or the second frame region.

9. The display panel according to claim 1, further comprising a plurality of data lines configured to transmit data signals, wherein each of the data lines is electrically connected to the pixel circuits in two different columns and writes the data signals to two of the pixel circuits in a same row in a time-sharing manner.

10. A display device, comprising a display panel wherein the display panel comprises:

a gate driving circuit comprising odd-th gate driving units in a cascade connected arrangement and even-th gate driving units in a cascade connected arrangement; and a plurality of rows of pixel circuits, wherein each row of the pixel circuits comprises a plurality of the pixel circuits, each of odd rows of the pixel circuits is electrically connected to a corresponding one of the odd-th gate driving units, and each of even rows of the pixel circuits is electrically connected to a corresponding one of the even-th gate driving units;

wherein each of the pixel circuits comprises a driving transistor and at least one oxide thin-film transistor, and a gate of the driving transistor is electrically connected to one of a source or a drain of the at least one oxide thin-film transistor;

wherein the display panel comprises odd-th scan lines and even-th scan lines; and one of the odd-th scan lines is electrically connected to a corresponding one of the odd-th gate driving units, one of the odd rows of the pixel circuits is electrically connected to two of the odd-th scan lines, one of the even-th scan lines is electrically connected to a corresponding one of the even-th gate driving units, and one of the even rows of the pixel circuits is electrically connected to two of the even-th scan lines.

11. The display device according to claim 10, the at least one oxide thin-film transistor comprises a first transistor, and one of a source or a drain of the first transistor is electrically connected to the gate of the driving transistor; and each of the pixel circuits further comprises:

a second transistor, wherein one of a source or a drain of the second transistor is electrically connected to one of a source or a drain of the driving transistor, another one of the source or the drain of the second transistor is electrically connected to another one of the source or the drain of the first transistor, a gate of the second transistor is electrically connected to an output end of an N-th gate driving unit, and the second transistor is a polycrystalline silicon thin-film transistor; and a third transistor, wherein one of a source or a drain of the third transistor is electrically connected to another one of the source or the drain of the first transistor, a gate of the third transistor is electrically connected to an output end of an (N−2)-th gate driving unit, and the third transistor is a polycrystalline silicon thin-film transistor.

12. The display device according to claim 11, wherein each of the pixel circuits further comprises a fourth transistor, one of a source or a drain of the fourth transistor is electrically connected to another one of the source or the drain of the third transistor and is configured to receive an initial signal, a gate of the fourth transistor is electrically connected to the output end of the N-th gate driving unit or the output end of the (N−2)-th gate driving unit, and the fourth transistor is a polycrystalline silicon thin-film transistor.

13. The display device according to claim 10, wherein the at least one oxide thin-film transistor comprises: a first transistor, wherein one of a source or a drain of the first transistor is electrically connected to the gate of the driving transistor, a gate of the first transistor is electrically connected to an (N−2)-th gate driving unit, and the one of the source or the drain of the first transistor is configured to receive an initial signal; and a second transistor, wherein one of a source or a drain of the second transistor is electrically connected to the gate of the driving transistor, another one of the source or the drain of the second transistor is electrically connected to one of a source or a drain of the driving transistor, a gate of the second transistor is electrically connected to an N-th gate driving unit.

14. The display device according to claim 10, wherein ones of the odd rows or the even rows of the pixel circuits display row-by-row in sequence in a first period of one frame, and another ones of the odd rows or the even rows of the pixel circuits display row-by-row in sequence in a second period of one frame; and a start time of the first period is earlier than a start time of the second period.

15. The display device according to claim 14, wherein the odd-th gate driving units output odd rows of scan signals, and the even-th gate driving units output even rows of scan signals;

the odd-th gate driving units are electrically connected to the odd rows of the pixel circuits to provide the odd rows of the scan signals to the odd rows of the pixel circuits, and the even-th gate driving units are electrically connected to the even rows of the pixel circuits to provide the even rows of the scan signals to the even rows of the pixel circuits;

each of the scan signals in ones of the odd rows or the even rows of the scan signals comprises a leading edge of a pulse in a third period of one frame, each of the scan signals in another ones of the odd rows or the even rows of the scan signals comprises the leading edge of the pulse in a fourth period of one frame, and the leading edge is one of a rising edge or a falling edge; and a start time of the third period is earlier than or at a same time as a start time of the fourth period, and an end time of the fourth period is earlier than or at a same time as a start time of the first period.

16. The display device according to claim 15, wherein the odd-th gate driving units output the odd rows of the scan signals according to first start signals, and the even-th gate driving units output the even rows of the scan signals according to second start signals; and the first start signals and the second start signals have different phases.

17. The display device according to claim 16, wherein the display panel is provided with a first frame region, a display region, and a second frame region, and the display region is positioned between the first frame region and the second frame region; and both the odd-th gate driving units and the even-th gate driving units are positioned in the first frame region or the second frame region.

18. The display device according to claim 16, wherein the display panel is provided with a first frame region, a display region, and a second frame region, and the display region is positioned between the first frame region and the second frame region; and the odd-th gate driving units are positioned in one of the first frame region or the second frame region, and the even-th gate driving units are positioned in another one of the first frame region or the second frame region.

* * * * *